(12) United States Patent
State et al.

(10) Patent No.: US 11,893,690 B2
(45) Date of Patent: Feb. 6, 2024

(54) 3D RECONSTRUCTION WITH SMOOTH MAPS

(71) Applicant: DASSAULT SYSTEMES, Velizy Villacoublay (FR)

(72) Inventors: Serban Alexandru State, Velizy Villacoublay (FR); Eloi Mehr, Velizy Villacoublay (FR); Yoan Souty, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

(21) Appl. No.: 17/949,823

(22) Filed: Sep. 21, 2022

(65) Prior Publication Data

US 2023/0036219 A1    Feb. 2, 2023

Related U.S. Application Data

(63) Continuation of application No. 17/139,121, filed on Dec. 31, 2020, now Pat. No. 11,790,605.

(30) Foreign Application Priority Data

Dec. 31, 2019    (EP) ..................................... 19306796

(51) Int. Cl.
*G06T 17/20*    (2006.01)
*G06F 30/23*    (2020.01)
(Continued)

(52) U.S. Cl.
CPC ............. *G06T 17/20* (2013.01); *G06F 30/17* (2020.01); *G06F 30/23* (2020.01); *G06T 5/002* (2013.01)

(58) Field of Classification Search
None
See application file for complete search history.

(56) References Cited

U.S. PATENT DOCUMENTS

| 8,107,726 B2 | 1/2012 | Xu et al. |
| 2002/0012454 A1 | 1/2002 | Liu et al. |

(Continued)

OTHER PUBLICATIONS

Tabb, Shape from Silhouette Probability Maps: Reconstruction of Thin Objects in the Presence of Silhouette Extraction and Calibration Error, 2013, Proceedings of the IEEE Conference on Computer Vision and Pattern Recognition, pp. 161-168 (Year: 2013).

(Continued)

*Primary Examiner* — Anh-Tuan V Nguyen
(74) *Attorney, Agent, or Firm* — Oblon, McClelland, Maier & Neustadt, L.L.P.

(57) ABSTRACT

A computer-implemented method for 3D reconstruction including obtaining 2D images and, for each 2D image, camera parameters which define a perspective projection. The 2D images all represent a same real object. The real object is fixed. The method also includes obtaining, for each 2D image, a smooth map. The smooth map has pixel values, and each pixel value represents a measurement of contour presence. The method also includes determining a 3D modeled object that represents the real object. The determining iteratively optimizes energy. The energy rewards, for each smooth map, projections of silhouette vertices of the 3D modeled object having pixel values representing a high measurement of contour presence. This forms an improved solution for 3D reconstruction.

16 Claims, 9 Drawing Sheets

(51) Int. Cl.
*G06T 5/00* (2006.01)
*G06F 30/17* (2020.01)

(56) References Cited

U.S. PATENT DOCUMENTS

| | | | |
|---|---|---|---|
| 2003/0063086 A1 | 4/2003 | Baumberg | |
| 2007/0014457 A1 | 1/2007 | Jolly et al. | |
| 2009/0027398 A1* | 1/2009 | Frisken | G06T 11/203 345/442 |
| 2009/0219286 A1* | 9/2009 | Wei | G06T 15/005 345/424 |
| 2010/0111370 A1 | 5/2010 | Black et al. | |
| 2010/0277571 A1 | 11/2010 | Xu et al. | |
| 2011/0081066 A1* | 4/2011 | Jolly | G06T 7/174 382/131 |
| 2012/0313955 A1 | 12/2012 | Choukroun | |
| 2012/0314974 A1 | 12/2012 | Yang | |
| 2013/0230211 A1 | 9/2013 | Tanabiki et al. | |
| 2013/0315470 A1 | 11/2013 | Watson et al. | |
| 2014/0078172 A1 | 3/2014 | Systrom et al. | |
| 2015/0036900 A1 | 2/2015 | Vik et al. | |
| 2016/0253842 A1 | 9/2016 | Shapira et al. | |
| 2018/0101979 A1 | 4/2018 | Higaki et al. | |
| 2018/0275637 A1* | 9/2018 | Elber | G06T 19/20 |
| 2019/0026942 A1 | 1/2019 | Zhang | |
| 2021/0049397 A1* | 2/2021 | Chen | G06V 10/764 |
| 2021/0059796 A1* | 3/2021 | Weiss | G06N 3/047 |
| 2021/0158551 A1* | 5/2021 | Fujigaki | G06T 7/74 |

OTHER PUBLICATIONS

Chenglei Wu, et al.; "Model-Based Teeth Reconstruction"; ACM Transactions on Graphics, ACM, NY, US; vol. 35, No. 6; Nov. 11, 2016; XP058306285; ISSN: 0730-0301; 13 pages.
Watchama Photong, et al.; "Generation and Quality Improvement of 3D Models from Silhouettes of 2D Images"; Journal of the Chinese Institute of Engineers—Zhongguo Gongcheng Xuekan; vol. 41, No. 3; Apr. 3, 2018; XP055723864; ISSN: 0253-3839; 14 pages.
Mathias Gallardo, et al.; "Dense Non-Rigid Structure-from-Motion and Shading with Unknown Albedos"; 2017 IEEE International Conference on Computer Vision (ICCV); IEEE; Oct. 22, 2017; [retrieved on Dec. 22, 2017]; 9 pages.
Y. Yemez, et al.; "Shape from Silhouette Using Topology-Adaptive Mesh Deformation"; Pattern Recognition Letters, Elsevier, Amsterdam, NL; vol. 30, No. 13; Oct. 1, 2009; XP026445508; ISSN: 0167-8655; 10 pages.
Suman Sedai, et al.; "A Gaussian Process Guided Particle Filter for Tracking 3D Human Pose in Video"; IEEE Transactions on Image Processing, IEEE Service Center, Piscataway, NJ, US; vol. 22, No. 11; Nov. 1, 2013; ISSN: 1057-7149; [retrieved on Sep. 12, 2013]; 15 pages.
Extended Search Report dated Aug. 28, 2020 in Europe Patent Application No. 19306796.4-1210; 14 pages.
E. Catmull, et al.; "Recursively Generated B-Spline Surfaces on Arbitrary Topological Meshes"; Computer-Aided Design; 10(6); 1978; 6 pages.
Thomas J. Cashman, et al.; "What Shape are Dolphins? Building 3D Morphable Models from 2D Images"; IEEE Transactions on Pattern Analyis and Machine Intelligence; 35(1), 2012; 21 pages.
V. Estellers, et al.; "Compression for Smooth Shape Analysis"; arXiv preprint arXiv:1711.10824; 2017; Abstract Only; 3 pages.
V. Estellers, et al.; "Robust Fitting of Subdivision Surfaces for Smooth Shape Analysis"; International Conference on 3D Vision (3DV); IEEE; 2018; 9 pages.
Wenzel Jakob, et al.; "Instant Field-Aligned Meshes"; ACM Transactions on Graphics (Proceedings of Siggraph Asia); 34(6); 2015; Abstract Only, 4 pages.
Kutulakos, Kiriakos N., and Steven M. Seitz. "A theory of shape by space carving." International journal of computer vision 38 (2000) : 199-218.
Nathan Litke et al.; "Fitting Subdivision Surfaces"; Proceedings of the Conference on Visualization '01; IEEE, 2001; 6 pages.
Aaron Lee, et al.; "Displaced Subdivision Surfaces"; Proceedings of the 27th Annual Conference on Computer Graphics and Interactive Techniques; ACM Press/Addison-Wesley Publishing Co., 2000; 10 pages.
Saining Xie, et al.; "Holistically-Nested Edge Detection"; Proceedings of the IEEE International Conference on Computer Vision; 2015; 9 pages.
Tony Derose, et al.; "Subdivision Surfaces in Character Animation"; Proceedings of the 25th Annual Conference on Computer Graphics and Interactive Techniques, ACM; 1998; 10 pages.
Guillaume Lavoue, et al.; "Semi-Sharp Subdivision Surface Fitting Based on Feature Lines Approximation"; Computers & Graphics 33(2); vol. 33, Issue 2, Apr. 2009; Abstract Only; 3 pages.

* cited by examiner (bottom row shows section views for better visibility)

3D RECONSTRUCTION WITH SMOOTH MAPS

CROSS-REFERENCE TO RELATED APPLICATIONS

This application is a Continuation of U.S. patent application Ser. No. 17/139,121 filed Dec. 31, 2020, which claims priority under 35 U.S.C. § 119 or 365 to European Application No. 19306796.4, filed Dec. 31, 2019. The entire contents of the above applications are incorporated herein by reference.

FIELD

The disclosure relates to the field of computer programs and systems, and more specifically to a method, system and program for 3D reconstruction.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

In this context and other contexts, 3D reconstruction is gaining wide importance. 3D reconstruction pertains to computer vision techniques that allow determining 3D modeled objects based on data representing real objects or real scenes. Such techniques may be useful to fields such as virtual and augmented reality (more generally, any kind of immersive experience), video games, manufacturing and 3D printing, and/or 3D modeling.

While much research effort has been made in this field in the past years, there is still a need for an improved solution for 3D reconstruction.

SUMMARY

It is therefore provided a computer-implemented method for 3D reconstruction. The method comprises providing 2D images and, for each 2D image, camera parameters which define a perspective projection. The 2D images all represent a same real object. The real object is fixed. The method also comprises providing, for each 2D image, a smooth map. The smooth map has pixel values, and each pixel value represents a measurement of contour presence. The method also comprises determining a 3D modeled object that represents the real object. The determining iteratively optimizes energy. The energy rewards, for each smooth map, projections of silhouette vertices of the 3D modeled object having pixel values representing a high measurement of contour presence.

The method may comprise one or more of the following:
- the smooth map comprises local extrema corresponding to contour probability maxima, the energy rewarding high contour probability at the projections of the silhouette vertices;
- the smooth map is a function of a contour probability map;
- the function is a smoothing of an affine mapping;
- the smoothing comprises at least one application of a Gaussian blur to the contour probability map, or a convolution of the contour probability map with a kernel obtained from a Laplace distribution;
- the smoothing comprises determining an envelope of application of a family of Gaussian blurs to the contour probability map, each Gaussian blur having a different kernel size;
- the energy comprises a term of the type $E_{fit} = \Sigma_{i,j} E_i(\pi_i(s_{ij}))^2$ where, for a 2D image i, $E_i(\bullet)$ denotes the smooth map, $s_{ij}$ denotes a silhouette point j, and $\pi_i(\bullet)$ denotes a projection transformation;
- the 3D modeled object is a control mesh of a subdivision surface;
- the method further comprises, at each iteration of the optimizing:
  - providing a current control mesh;
  - subdividing the current control mesh into a subdivided mesh;
  - for each 2D image:
    - projecting the subdivided mesh on the 2D image;
    - computing a 2D silhouette of the 3D modeled object in the 2D image; and
    - identifying points of the subdivided mesh corresponding to the 2D silhouette, as the silhouette vertices; and
  - modifying the current control mesh to reduce the energy; and/or
- the energy further rewards lowness of a sum of squares of lengths of all edges in the control mesh, lowness of a sum of squares of principal curvature values at densely sampled points of a limit surface of the control mesh, and/or regularity of faces of the control mesh.

It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Embodiments will now be described, by way of non-limiting example, and in reference to the accompanying drawings, where.

DETAILED DESCRIPTION

Figure 1:
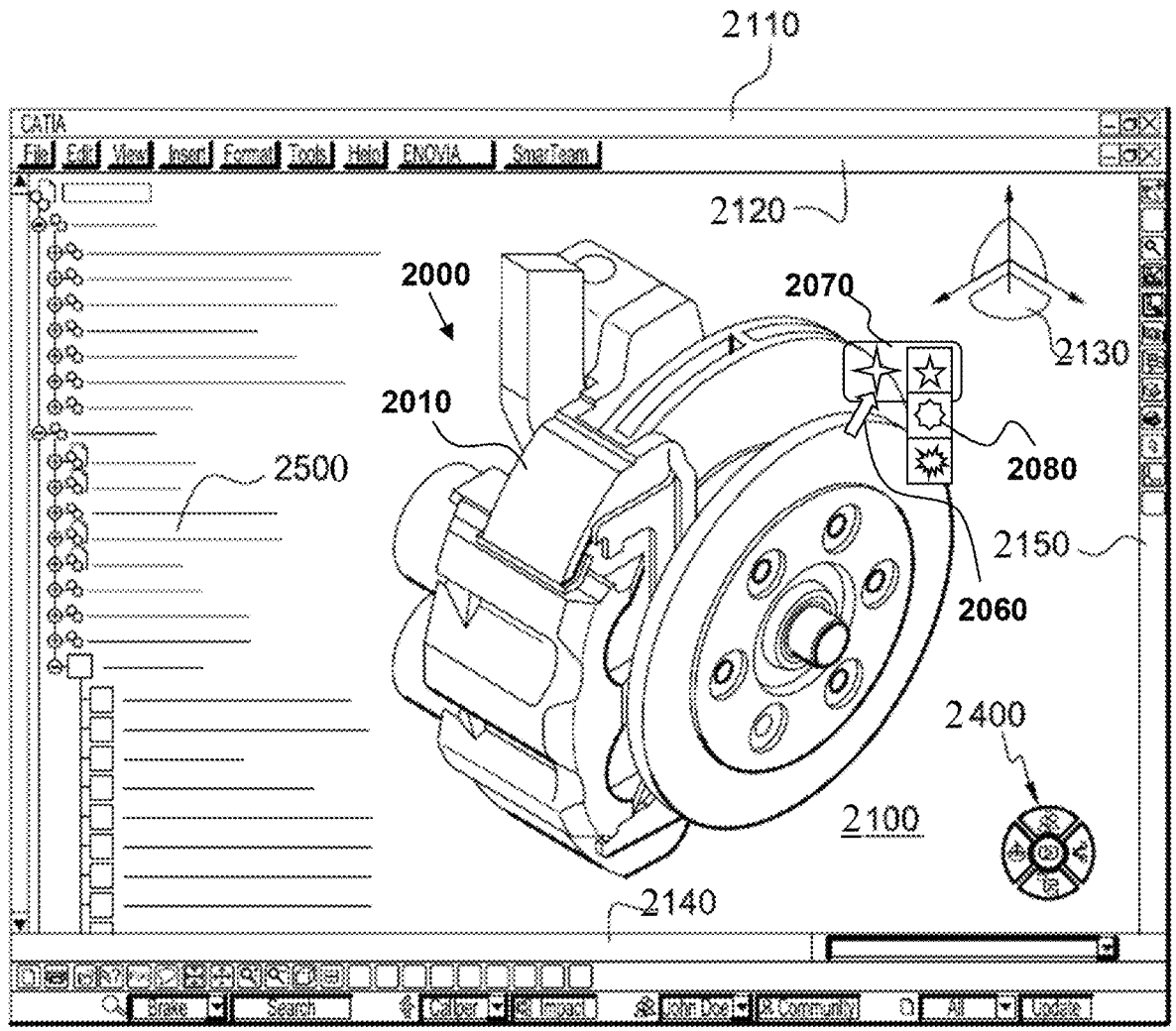
FIG. 1 shows an example of a graphical user interface of the system.

Described is a computer-implemented method for 3D reconstruction. The method comprises providing 2D images and, for each 2D image, camera parameters which define a perspective projection. The 2D images all represent a same real object. The real object is fixed. The method also comprises providing, for each 2D image, a smooth map. The smooth map has pixel values, and each pixel value represents a measurement of contour presence. The method also comprises determining a 3D modeled object that represents the real object. The determining iteratively optimizes energy. The energy rewards, for each smooth map, projections of silhouette vertices of the 3D modeled object having pixel values representing a high measurement of contour presence.

This forms an improved solution for 3D reconstruction.

The method falls within the range of structure-from-motion analysis techniques. Indeed, the method allows to reconstruct in 3D a real object based on 2D images. The 2D images are relatively simple and costless to obtain, compared to other types of signals. The method thus forms a relatively simple and costless 3D reconstruction technique.

In addition, the optimization is an iterative optimization. Iterative optimization techniques are known to be practical ways of solving optimization problems. The method thus performs relatively efficiently.

Now, the method relies in particular on maps having pixel values each representing a measurement of contour presence. Since the 3D modeled object optimizes an energy that rewards, for each contour map, projections of silhouette vertices of the 3D modeled object having pixel values representing a high measurement of contour presence, the method allows determining a 3D modeled object whose silhouette is projected on contours in the 2D images, to the extent possible. The method thus builds on an observation that the silhouette of a real object represented by a 2D image translates into contours in the 2D image. As a result, the 3D reconstruction allowed by the method is relatively accurate.

Furthermore, the maps provided in the method are specifically smooth maps. As a result, the optimization is enabled to follow paths leading to local extrema of the maps during the iterations, thereby robustly converging toward an optimal 3D modeled object. This results in relatively high accuracy and robustness of the method. The iterative optimization may indeed be gradient-based, and for example include computations of gradients of the smooth maps to follow such gradients.

The 2D images each represent a physical signal forming a 2D graphical representation of the real object, for example in a grid arrangement of pixels. The grids may all be regular and/or rectangular. The 2D images may comprise RGB images and/or grayscale images. The determining may for example be performed exclusively based on RGB images and/or grayscale images. The 2D images may comprise images captured by one or more physical cameras each having one or more respective sensors, such as photographs. The providing of the 2D images may comprise such capturing for at least part of the 2D images, and/or receiving from a distant system and/or retrieving in a memory at least (another) part of the 2D images.

The 2D images all represent a same real object. For example, the 2D images may have been captured at different times each with a same and unique camera viewing the same and unique real object, for example with different camera parameters (e.g. with different camera extrinsic parameters, including from different viewpoints, and/or with different camera intrinsic parameters). At least part of the 2D images may represent the real object from different viewpoints. The method thus combines several pieces of 2D graphical information on the real object (i.e. the 2D images) to build a 3D model of the real object. In examples, the 2D images may form different frames of a same video caption of the real object.

The camera parameters are provided by the method to the determining. In other words, the camera parameters are known before the determining (i.e. the providing of the camera parameters may be performed prior to the determining). The camera parameters may for example be known before performing the method, or the method may comprise calculating such camera parameters (for example approximately) separately and before the determining, e.g. according to any known algorithm. The method is thus relatively efficient, since the determining does not need to compute said camera parameters within the optimization. Rather, the determining may use as such the provided camera parameters to operate the rewarding (i.e. the rewarding by the optimized energy of the projections of the silhouette vertices having pixel values representing a high measurement of contour presence for each smooth map). The iterative optimization may indeed comprise iteratively determining the silhouette vertices respective to a given 2D image based on the camera parameters, and projecting the silhouette vertices on the 2D image according to the camera parameters. The camera parameters of each 2D image may have been associated/attached to the image at the time of capturing the image, according to any known technique (out of the scope of the present discussion).

The camera parameters for each 2D image define a respective perspective projection, according to which the (fixed) real object is viewed in the 2D image. This simplifies the method, as cameras usually capture 2D images according to such a perspective. This also allows to correctly take into account the perspective, and not approximate it, e.g. with a parallel projection, because that would introduce errors in the process, especially for objects that are photographed from a close distance, and for which therefore the perspective is more pronounced.

The real object is fixed in the 2D images. In other words, across all the 2D images inputted to the determining, the real object is immobile. This means that the real object is not moved and not deformed, at least substantially (i.e. deformations and movements are negligible relative to the dimensions of the real object). As a result, the determining may be relatively simple to implement, and the optimizing may converge relatively quickly and robustly. A fixed real object allows an easier and faster combination of the information provided by the different images, as said information is more directly comparable. The method thus lies within an industrial application allowing 3D reconstruction of a still physical object, such as a non-biological object, e.g. an industrial product.

In examples, the method may comprise a user-machine interaction wherein a user captures the 2D images with a video camera by moving the video camera around a fixed real object, for example at a free distance from the real object. The video camera may be standard and capture video frames according to a perspective projection. The method thus forms a simple structure-from-motion analysis.

The providing for each 2D image of a respective smooth map is now discussed.

Each smooth map comprises pixels, for example in the same grid arrangement as the 2D images. Each pixel of each smooth map has a value which represents a measurement of contour presence in the corresponding pixel of the respective 2D image. In other words, each smooth map pixel value measures local presence of an image contour.

By "contour", it is meant any location of a 2D image which corresponds to a (e.g. as sharp as possible) separation between two different textures of the 2D image, each texture corresponding to a different real-world material. The set of contours thus (e.g. approximately) includes the projected boundary or visible silhouette of a real-world object or the boundary of a visible silhouette of a (identifiable) part of a real-world object. Such a notion is known per se from the field of image processing, in particular applied to 3D reconstruction. As known, the measurement of contour presence may be a function of the gradient of the pixel values of the 3D image. Many different techniques exist in the prior art for obtaining such a measurement.

By "measurement", it is meant any information on contour presence at the location corresponding to the pixel value. Values of different pixels of a smooth map are comparable together, such that presence of contour can be compared at different corresponding locations. The pixel values may monotonously correspond to contour presence (decreasingly respectively increasingly, i.e. a high respectively low pixel value denoting contour presence more than a low respectively high pixel value, thus representing a relatively high respectively low measurement of contour presence).

By "smooth", it is meant that the smooth map has, at least in a vicinity (i.e. neighborhood) of image contours (i.e. everywhere or, alternatively in such a vicinity), non-zero gradients, that it locally varies in a monotonous way towards local optima, and that it presents a $C_0$ continuity (i.e. it is sufficient, e.g. at the optimum, to have only point continuity, not derivative continuity).

By "rewarding, for a smooth map, projections of silhouette vertices of the 3D modeled object having pixel values representing a high measurement of contour presence", it is meant that the optimization favors a 3D modeled object having silhouette vertices which project on 2D points of the respective 2D image (referred to as "projections of silhouette vertices") corresponding to pixels of the smooth map whose values are all the more indicative of the presence of a contour. The optimizing may perform such rewarding by minimizing an objective function which comprises a cost term penalizing non-presence of contour, i.e. a low measurement of contour presence. The optimizing may minimize said cost term, ceteris paribus, thus maximizing the overall measurement of contour presence by the projections of silhouette vertices.

Thanks to the measurement being provided as a smooth map for each 2D image, the optimizing may iteratively follow a monotonous gradient path of each of the smooth maps to converge with a relatively high speed toward a local optimum corresponding to a local maximum of contour presence.

Each smooth map may for example comprise local extrema each corresponding to a respective local maximum of contour probability (i.e. the contour probability is locally maximum at a local extremum of the smooth map). In such a case, the energy may perform the above-discussed rewarding simply as follows: the energy may reward high contour probability at the projections of the silhouette vertices. The smooth map may in particular vary from values representing a respective zero contour probability to said local extrema. Thanks to its smoothness, the gradient of the smooth map is non-zero even at pixels corresponding to zero contour probability, and the gradient-based iterative optimization may still be successfully pushed toward the local extrema by the rewarding.

The smooth map may for example be a function of a contour probability map. This means that the smooth map is computed from a contour probability map and inherits the information contained therein. In particular, the function maintains positions and values of the extrema (i.e. the extrema of the smooth map are the same, in position and in value—e.g. modulo an affine mapping, e.g. a 1−p inversion, as discussed later—, as the extrema of the contour probability map), and the function results in non-zero gradients, in monotonous variations towards local optima, and in $C_0$ continuity. The method may comprise providing a contour probability map for each 2D image, and applying the function to each contour probability map (so as to output the corresponding smooth map). This allows determining a relatively accurate 3D modeled object, since the optimizing fully relies on the relatively fine information provided by the contour probability map. The function may be a monotonous function.

A contour probability map is, as known, a map which has pixel values each representing a probability of contour presence. Such a map may be computed in any know manner, for example based on a machine-learning scheme implemented on an annotated dataset of 2D images associated with contour probability maps or contour maps (a contour map being a map whose pixel values each represent binarily contour presence or absence). Such a machine-learning may for example be performed according to or similarly to the teaching of paper by S. Xie, Z. Tu., *Holistically-nested edge detection*, in Proceedings of the IEEE international conference on computer vision (pp. 1395-1403), 2015, which is incorporated herein by reference. The edge detection method described in this paper is based on the learning of a network for predicting the edges of an image, by supervised training on an image dataset where annotated the edges. The network extracts multiscale predictions, and the classification loss for each pixel compares the cross-entropy between the binary mask ground-truth of the edges and the prediction of the edges at each scale. The predictions at each scale are then aggregated to give a final prediction.

Alternatively, the method may compute the contour probability maps according to the teaching to any one of a number of other papers which disclose a machine-learning to predict edges in a supervised manner (the differences of which are mainly expressed in terms of architectures and losses), for example the following papers which are all incorporated herein by reference:

*DeepEdge: A Multi-Scale Bifurcated Deep Network for Top-Down Contour Detection*, Gedas Bertasius, Jianbo Shi, Lorenzo Torresani, CVPR 2015;

*Object Contour Detection with a Fully Convolutional Encoder-Decoder Network*, Jinmei Yang, Brian Price, Scott Cohen, Honglak Lee, Ming-Hsuan Yang, CVPR 2016; or

*Pixel-Wise Deep Learning for Contour Detection*, Jyh-Jing Hwang, Tyng-Luh Liu, ICLR Workshop 2015.

Yet alternatively the contour probability map may be computed by a deterministic method. Such deterministic methods are widely known, and the method may for example comprise computing the Chamfer map of the result of a Canny-edge detection.

The function may be (the result of) a smoothing of a monotonous (e.g. affine) mapping. The smoothing is a function as described above, that is, the smoothing maintains positions and values of the extrema, and the smoothing results in non-zero gradients, in monotonous variations towards local optima, and in $C_0$ continuity. As a result of the combination of such a smoothing with a monotonous (e.g. affine) mapping, information of the initial probability map is maintained, in particular information allowing comparison of contour presence between different pixels. The affine mapping (i.e. function) may be the probability complementary mapping (i.e. 1 minus the probability). Thus, the smooth map may form a smoothed inverted contour probability map having pixel values each representing a probability of contour absence (i.e. the complementary value of a contour probability) after smoothing. This increases convergence speed. In such a case, the optimization problem is a minimization problem. Alternatively, the monotonous mapping may the identity. In such a case, the optimization problem is a maximization problem.

Any smooth map herein may for example result from a scheme which comprises computing a contour probability map (for example as discussed above), applying a monotonous (e.g. affine) mapping to the contour probability map (e.g. which may be the probability complementary mapping, or alternatively, simply the identity mapping), and smoothing the result of the mapping (in any known manner, for example as later described). The method may comprise performing the scheme for at least part (e.g. all) of said smooth maps, and/or receiving and/or retrieving at least part of said smooth maps as such.

The method may alternatively use a distance transform of the image in order to generate a map that contains the distance to the nearest contour at each pixel. However, such an approach requires a threshold value to identify the contours that have a probability value above that threshold and then compute the distance transform of the image. This means that the difference in probability of two contours that are both within the threshold is lost, and the contour probability information is not exploited in its entirety.

As mentioned above, the determining comprises an optimization scheme which is iterative and may be gradient-based, iteratively computing the gradient of the smooth maps for each silhouette vertex projection, to converge toward a 3D modeled object which achieves overall optimum across the smooth maps (thereby representing global maximum of contour probability).

The optimization may comprise, at each iteration, providing a "current" 3D modeled object, determining the projections of the silhouette vertices, and modifying the 3D modeled object to reduce the energy (e.g. including computing the gradients of the smooth maps at pixels corresponding to the projections). The 3D modeled object as modified may be inputted to the next iteration as the "current" 3D modeled object of said next iteration, until a convergence criterion is reached.

The iterative optimization may start from a 3D modeled object which forms an approximation of the optimal 3D modeled object sought by the method. Such an initialization of the optimization with an approximate 3D model of the real object allows a fast and robust convergence of the optimization. This also makes it possible to be satisfied with a "smooth map" which is only "locally smooth", i.e. there can be zero gradient zones elsewhere, as long as locally, where the projection of the initial shape is located and up to the pixels of maximum contour probability, the gradients are "good". As a consequence, the smoothness requirement lies only in the vicinity of true contours, as long as the silhouettes of the initial shape project in these areas. Such an approximation may be obtained in any known manner, for example executing an existing 3D reconstruction technique. Examples are discussed later.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The method generally manipulates modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

By CAM system, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE system, it is additionally meant any solution, software of hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed of a plurality components from different fields of physics without CAD geometry data. CAE solutions allow the simulation and thus the optimization, the improvement and the validation of products to manufacture. Such CAE solutions are provided by Dassault Systèmes under the trademark DYMOLA®.

The 3D modeled object reconstructed by the method may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object reconstructed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

FIG. 1 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 2:
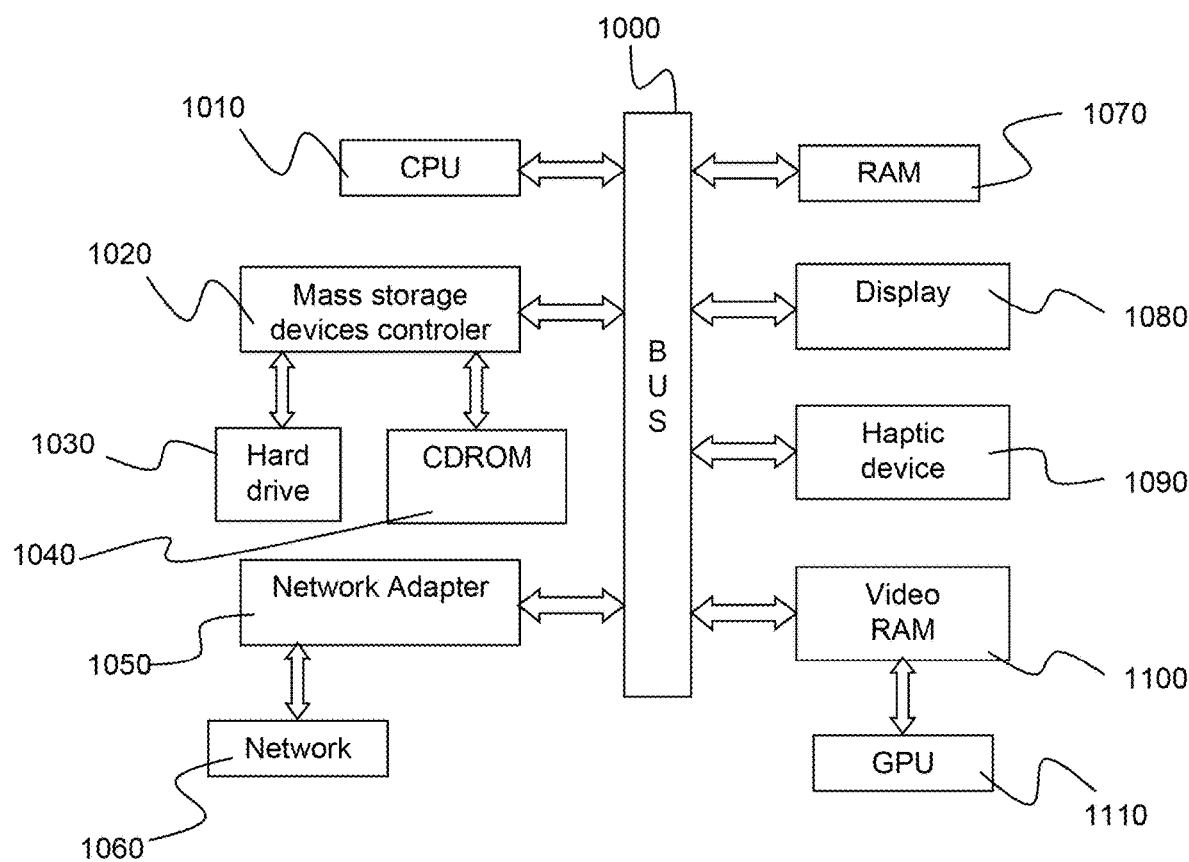
FIG. 2 shows an example of the system.

FIG. 2 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The method may be part of a process for designing a 3D modeled object, for example including editions of the reconstructed 3D modeled objects. "Designing a 3D modeled object" designates any action or series of actions which is at least part of a process of elaborating a 3D modeled object.

The method may be included in a manufacturing process, which may comprise, after performing the method, producing a physical product corresponding to the modeled object (for example after the editions). In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

An implementation of the method where the determined 3D modeled object is a control mesh of a subdivision surface is now discussed with reference to FIGS. 3-22.

The implementation of the method provides a new solution to generate a 3D modeled object (or 3D model) that fits multiple images of a given real-world object. The resulting model may be a control mesh for a subdivision surface that fits to an object's contours in multiple images, and that can easily be processed by existing CAD and/or CAM software.

A control mesh of a subdivision surface is a synthetic representation of a 3D shape, and as such it takes relatively little memory space and can be manipulated for editions relatively easily. Furthermore, such a control mesh may be subdivided to perform specific editions, for example add details, and/or to perform simulations requiring a certain finite element size. The method may comprise any such post-use of the obtained control mesh. In addition, the method may use the control mesh format in an efficient way to conduct the optimizing. Furthermore, the method may introduce terms in the energy specific to control meshes.

Subdivision surfaces have been used in 3D software for a long time. The implementation of the method may aim for subdivision surfaces based on quad-dominant control meshes and a Catmull-Clark subdivision scheme. The obtained control mesh and its defined subdivision surface may thus be according to the teaching of paper by E. Catmull, J. Clark., *Recursively generated b-spline surfaces on arbitrary topological meshes*, Computer-Aided Design, 10(6) (pp. 350-355), 1978, which is incorporated herein by reference.

Figure 3:
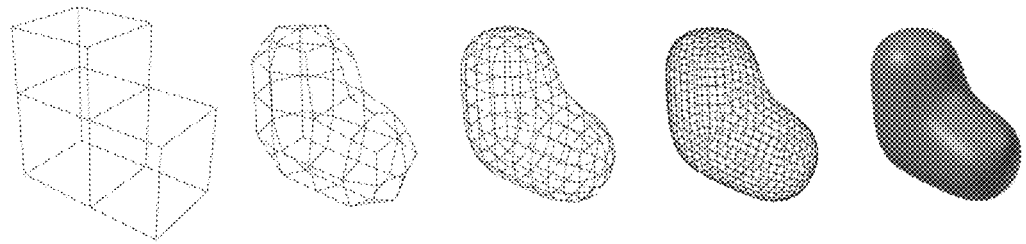
FIGS. 3, 4, 5, 6, 7, 8, 9, 10, 11, 12, 13, 14, 15, 16, 17, 18, 19, 20, 21 and 22 illustrate the method.

In this discussion of the implementation of the method, the terms "fitting a control mesh" and "fitting a subdivision surface" to a given target, are equivalent and pertain to the act of automatically moving the positions of the vertices of the control mesh so that its limit surface (or the mesh after a sufficient number of subdivision steps) fits the target. FIG. 3 illustrates the process of continuously subdividing a simple control mesh up to reaching the limit surface.

The implementation of the method allows obtaining of a control mesh that when sufficiently subdivided fits to multiple views of an existing object. The input data include raw 2D images with corresponding camera parameters, and an initial dense mesh that roughly approximates the object (in the same reference system as the cameras). The latter may be obtained, for instance, by using a space carving technique after (roughly) segmenting the images. This may be performed according to the teaching of paper by K. N. Kutulakos, S. M. Seitz, *A theory of shape by space carving*, International journal of computer vision, 38(3) (pp. 199-218), 2000, which is incorporated herein by reference. This paper shows how a mesh may be generated from multiple images of an object by space carving. This technique performs rough identification of the objects contours and generates an approximate dense mesh that cannot be used as is for editing in CAD and/or CAM software. However, it provides a suitable input to the implementation of the method.

The implementation of the method forms a new pipeline for generating a subdivision surface (i.e. a parametric shape) that fits to multiple images of the same object. The implementation of the method uses a subdivision surface because it provides a simple and generic model for a parametric shape and allows easy evaluation of the surface and its geometric characteristics. However alternatively, other models, e.g. a parametric exact boundary representation (used in CAD software), may also be optimized in the same manner.

Figure 4:
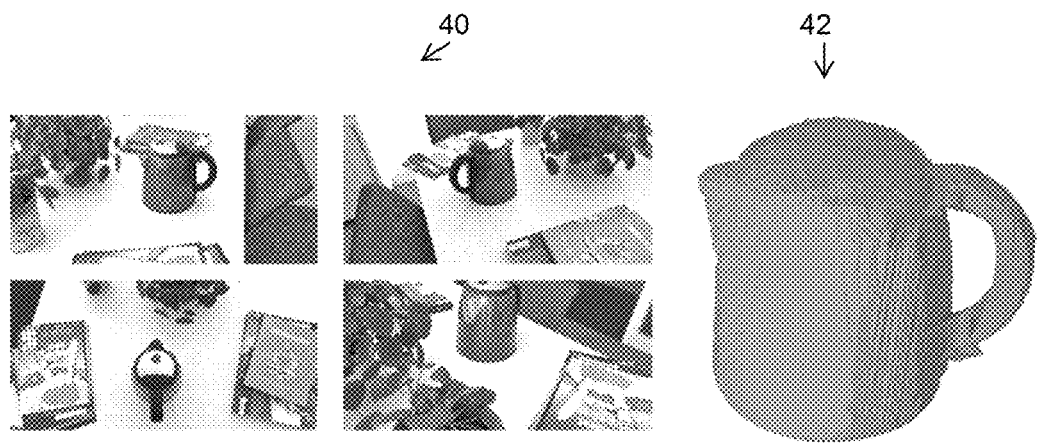
Figure 5:
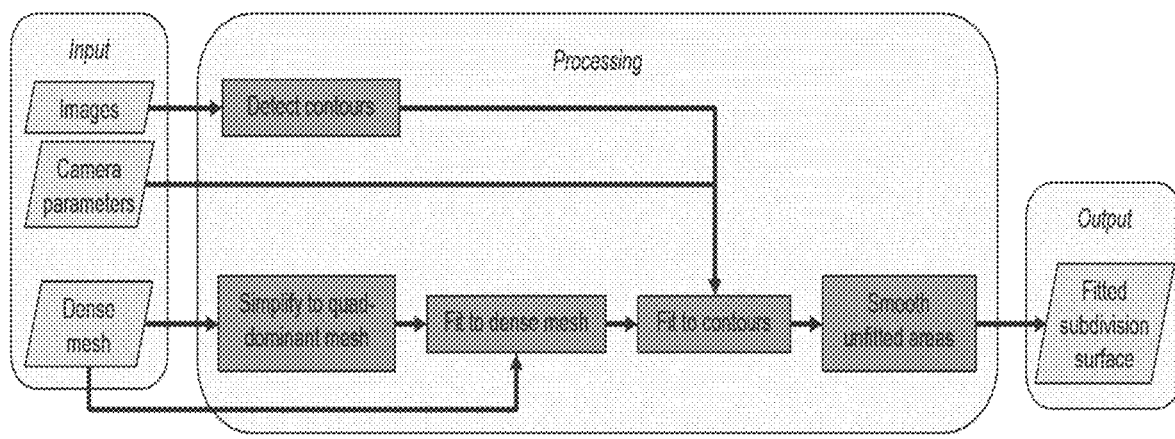
Figure 6:
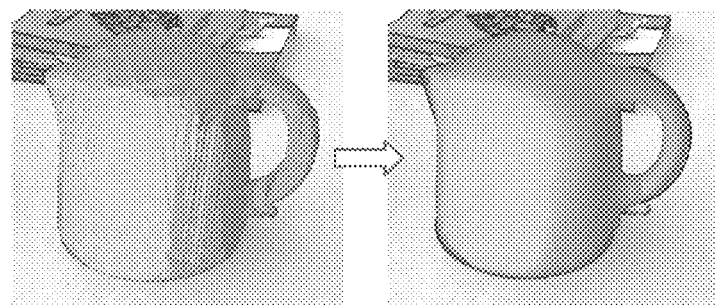

Referring to FIG. 4, starting from a set of images 40 of the object with the corresponding camera parameters, and a dense mesh 42 that roughly approximates the shape (such as one obtained by earlier-cited paper *A theory of shape by space carving*), the implementation of the method may create a simplified quad-dominant control mesh that when subdivided fits the object in the provided images according to the pipeline shown on FIG. 5. The more the images are relevant, i.e. the more they cover the object from all possible viewpoints, the more accurate the resulting 3D shape (i.e. the more it corresponds to the actual object). In examples, the 2D images provided in the implementation of the method may thus cover the real object from different viewpoints.

The images may then be pre-processed to detect all the contours in the image, including, but not limited to, those that correspond to the object. This may for example be performed as discussed earlier according to the teaching of paper *Holistically-nested edge detection*. This paper develops a new edge and boundary detection algorithm that uses a deep-learning model. The implementation of the method may use this solution to generate probability maps with all the contours in the provided image set (regardless of whether they are contours of the target object or not).

Separately, the implementation of the method may simplify the dense mesh into an initial control mesh. This may for example be performed as taught in paper by J. Wenzel, M. Tarini, D. Panozzo, and O. Sorkine-Hornung, *Instant field-aligned meshes*, ACM Transactions on Graphics (Proceedings of SIGGRAPH ASIA), 34 (6), 2015, which is incorporated herein by reference. This paper proposes a technique for simplifying a dense mesh into a uniform quad-dominant mesh. The implementation of the method may use this technique in a step of its proposed pipeline.

Since the two are rather far apart for the present purposes, the implementation of the method may use a scheme to fit this initial control mesh back to the dense mesh (using the point cloud corresponding to its vertices). This may for example be performed as taught by paper by V. Estellers, F. R. Schmidt, and D. Cremers, *Compression for smooth shape analysis*, arXiv preprint arXiv:1711.10824, 2017, and by paper V. Estellers, F. Schmidt, D. Cremers, *Robust Fitting of Subdivision Surfaces for Smooth Shape Analysis*, International Conference on 3D Vision (3DV) (pp. 277-285), IEEE, 2018, which are incorporated herein by reference. These papers introduce a scheme for fitting a control mesh to a target point cloud. Said scheme first generates an estimated control mesh that very roughly fits the shape defined by the cloud, and then applies an iterative linear optimization scheme to adapt the control mesh to the target. An existing public prototype is available and has been tested. The results are robust and satisfy the stated objective, which is the computational analysis of the shape. However, the resulting control mesh is not uniformly dense and therefore difficult to use for further editing. More importantly, using this scheme to reconstruct a 3D shape from multiple images would require first generating a dense point cloud from the same images. This constitutes a separate difficult problem that the implementation of the method may avoid.

Since the provided dense mesh is only a rough approximation, the subdivision of the resulting modified control mesh does not yet fit the contours of the object in the various images. The implementation of the method uses an optimization scheme to optimally fit to the objects contours in the images. Finally, the implementation of the method may also add a post-processing phase to further smooth areas of the resulting shape that were not fitted because no contour was found for that particular area in any of the provided images.

Details on these various steps of the implementation of the method shown on FIG. 5 are discussed hereunder.

The implementation of the method fits a rigid object to multiple views, and, therefore, the more relevant images are used, the better the result describes the real object. The implementation of the method does not require and may exclude precise identification of the right contour in each image, but it may process the raw images automatically. The implementation of the method may exclude manually selected constraint points. The implementation of the method may take into account a realistic perspective projection, which means that implementation of the method may use photos taken at any distance from the object. Because camera parameters are now provided by current capture devices, they need not be computed. Therefore, the silhouette of the object may be computed explicitly rather than by minimizing an energy, which leads to higher computation robustness and better performances. The implementation of the method may use as input approximate results (e.g. from older methods) to obtain a shape that both better fits the real object and can be further edited with existing software. Also, the result of the implementation of the method requires considerably less memory space than any dense mesh (or point cloud) obtained by existing techniques. The implementation of the method may allow addition of new energy terms to regularize the resulting shape. The implementation of the method may allow a post-processing phase that further smooths areas for which no contour was found in any image.

Examples of the generation of a simplified quad-dominant control mesh are now discussed.

The subdivision surface that the implementation of the method fits to the views may be defined by a quad-dominant control mesh. The initial form of the unfitted control mesh may either be provided as an input to the method or may be created from the provided dense mesh. For instance, the implementation of the method may use the method introduced by earlier-cited paper *Instant field-aligned meshes* to generate a simplified quad-dominant mesh from the provided dense mesh, but any other method that may generate a simplified quad-dominant mesh would be equally satisfying. It is important to note that the limit surface of the resulting control mesh has no reason to be precisely close to either the provided dense mesh or the actual object, as shown on FIG. 6.

Examples of fitting the control mesh to the dense input mesh are now discussed.

Figure 7:
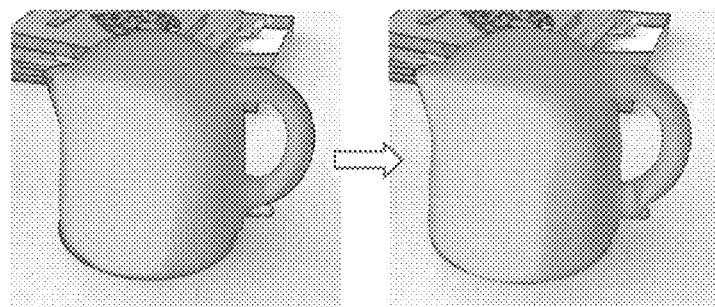
Figure 8:
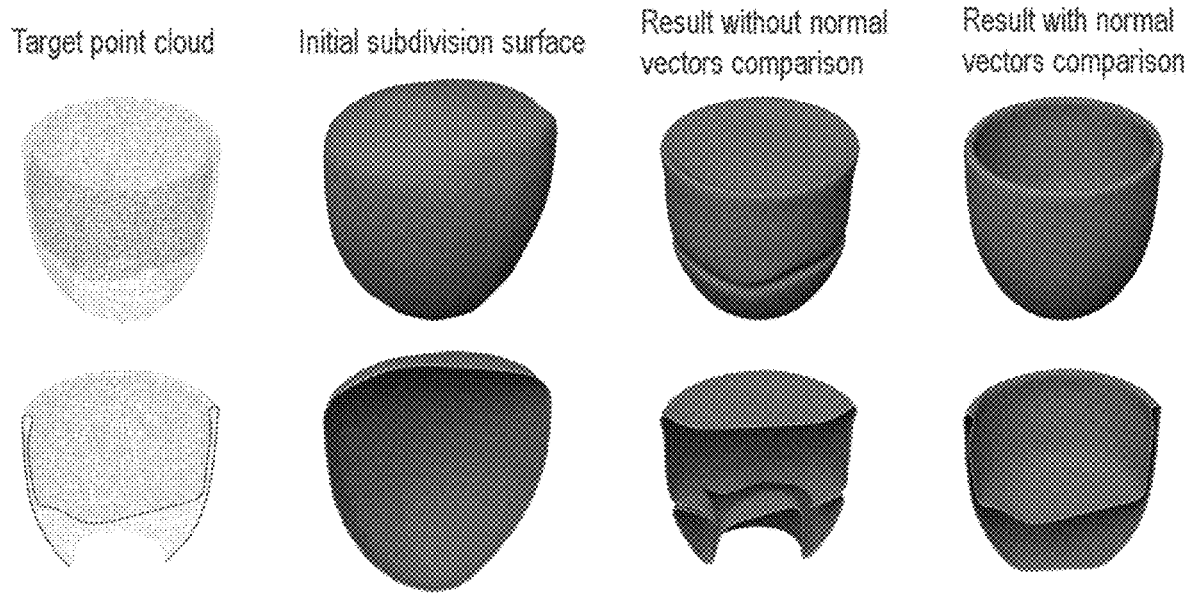

The implementation of the method may use the scheme proposed in earlier-cited papers *Compression for smooth shape analysis* and *Robust Fitting of Subdivision Surfaces for Smooth Shape Analysis* to fit the generated control mesh generated as best as possible to the input dense mesh, because this is a best first estimation of the actual object. FIG. 7 illustrates the result.

However, the implementation of the method may introduce some changes to said scheme. For instance, if the target point cloud corresponds to a relatively thin object with a cavity, e.g. a vase as represented on FIG. 8, and the simple control mesh is simply a convex subdivision surface that engulfs the target, the implementation of the method may establish a correct initial correspondence between the two, to obtain the cavity in the fitted subdivision surface. The implementation of the method may notably avoid wrong correspondences between areas that have opposite orientations.

The implementation of the method may therefore add a normal vectors comparison in the point correspondence computation: if the dot product of their normal vectors is lower than a threshold value, the two points are not in correspondence. Consequently, points on the outer shell are not attracted by target points on the inner shell of the object.

The implementation of the method may also add optional weight computation functionality based on the initial evaluation of the various energy terms. The weight coefficients for the energy terms may either be provided or else computed at the initial evaluation of the energy terms in order to ensure specific ratios between the four terms. These ratios can be either default values of the system or else user-provided.

The implementation of the method may also add a new energy term, using spring energy terms to attract the control points to their initial positions. This may be useful to keep as close as possible to the initial control mesh, or at least parts of it.

Lastly, the implementation of the method may also replace the generation of the non-uniform control mesh with the method introduced in earlier-cited paper *Instant field-aligned meshes*. This has been tested to lead to better results, in the present context.

Examples of contour detection are now discussed.

Figure 9:
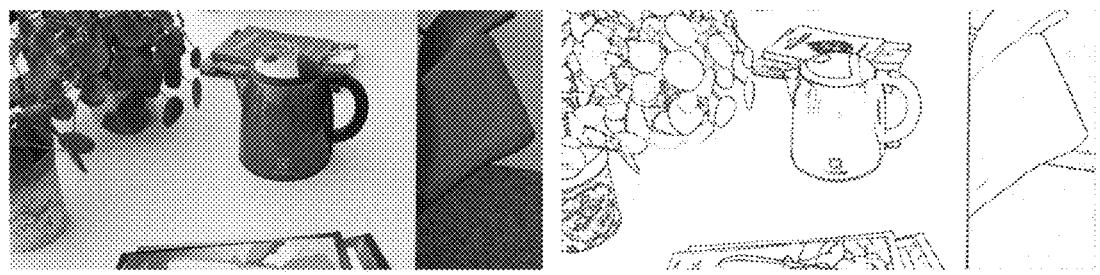

The implementation of the method may use the solution presented in earlier-cited paper *Holistically-nested edge detection* to generate a contour probability map for each image, as illustrated on FIG. 9. The pixels with the highest probability values in the map indicate the location of the detected contours. The detected contours have different probabilities, e.g. border contours of internal reflection artifacts have a lower probability than hard contrast contours that correspond to the actual border of the object in the image. The implementation of the method may invert the probability map in order to obtain a fitting energy map (i.e. compute a map corresponding to 1 minus the value of the probability map). The contour pixels thus correspond to the local minima of the fitting energy, which is better suited to a minimization scheme.

The implementation of the method may then compute points that lie on the apparent contour of the current shape of the subdivision surface (by subdividing the control mesh). These points may be projected, using the camera parameters, onto the fitting energy map. The lower the fitting energy value at the projection point, the more likely it is that the point is on an actual contour.

Two observations may be made.

Figure 10:
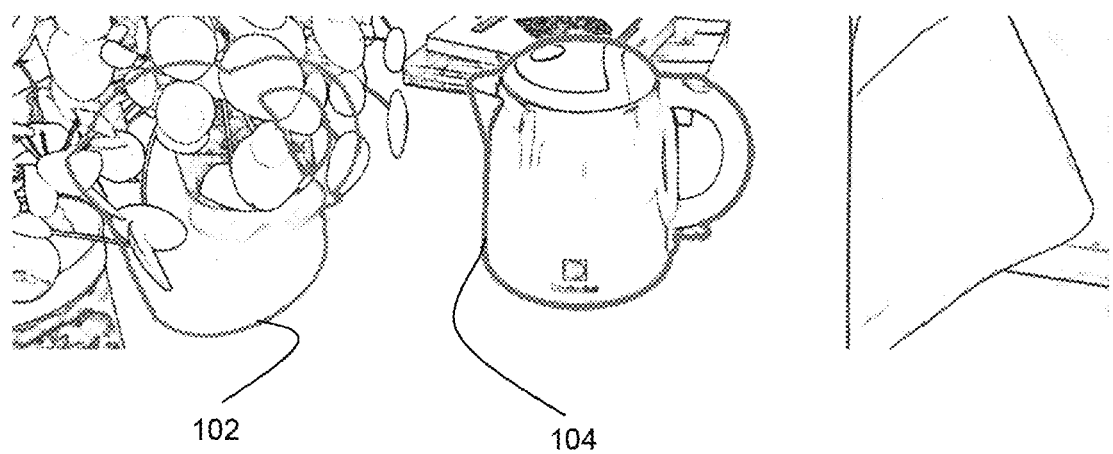
Figure 11:
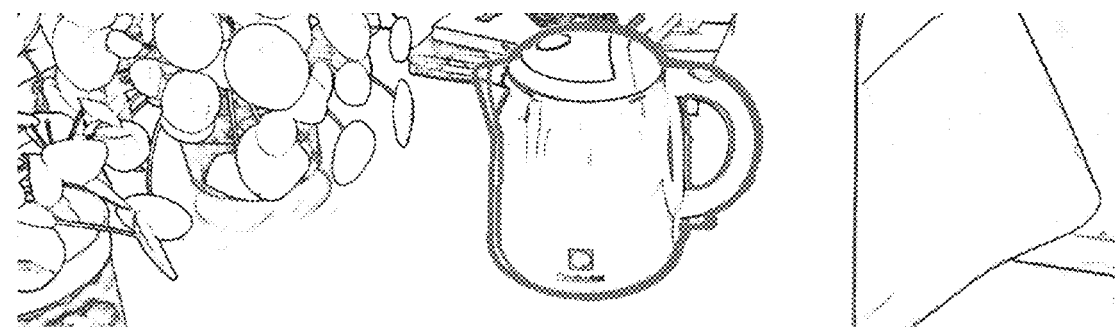

First, if the projected contour of the current shape (i.e. contour 102 in FIG. 10) were far from the target contour of the object in the image, it would be more difficult to converge towards the target contour (i.e. contour 104 in FIG. 10). This is due to the fact that the example contour detection does not eliminate all unwanted contours from the fitting energy map, and some of those contours may attract the shape during the optimal contour fitting phase.

However, since the implementation of the method starts from an approximation of the desired shape, in the same reference system as the one in which the camera parameters are defined, the initial apparent contour is generally not too far from the actual object's contour in the images (see FIG. 11), i.e. the probability to converge towards the correct contour is much higher.

Figure 12:
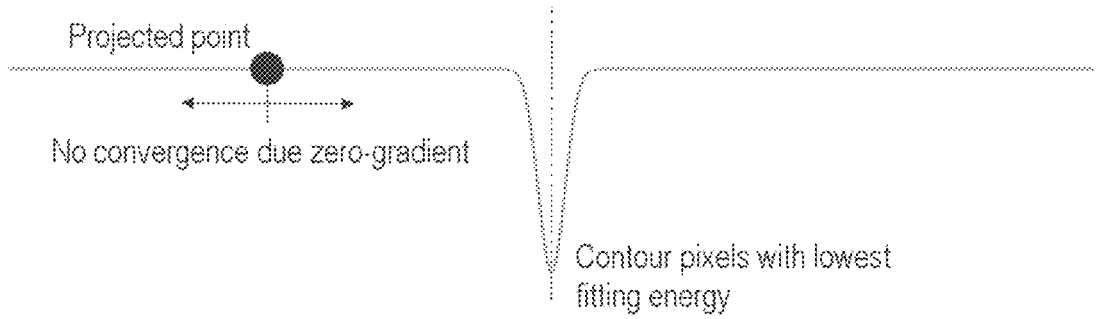
Figure 13:
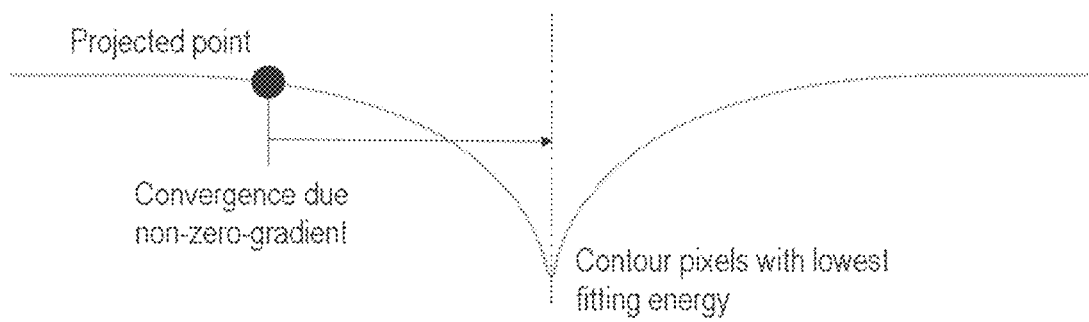

Second, even starting with point projections that are near the target contour, the local gradient of the fitting energy map may be very flat, effectively keeping the optimization from converging towards the target contour (see FIG. 12).

Since the technique of paper *Holistically-nested edge detection*, as any other contour detection algorithm, aims to generate (e.g. almost) binary images of clearly delineated contours, locally flat gradients are basically a specification feature of such techniques. Deep-learning techniques such as described in this paper are statistic in nature and thus obtain non-binary probability values that are, however, very close to 0 or 1 (and hence still contain flat gradient areas). This is especially true for high-resolution (e.g. 4K) images such as obtained by current capture devices. In order to avoid this kind of situation, the implementation of the method may apply a local filter to the fitting energy map to widen the area where the gradient is non-zero (see FIG. 13).

The smoothing filter may for example comprise at least one application of a Gaussian blur (applied to the contour probability map). The Gaussian blur operates a modification of the contour map from the shape of FIG. 12 featuring flat areas with zero gradients, to the shape of FIG. 13 which allows better convergence of the optimization.

A simple and single Gaussian blur reduces the amplitude. To avoid losing the minimum values in the contour image, the method may rather consider (e.g. apply) a smoothing which comprises determining an envelope of application of a family of Gaussian blurs to the contour probability map, each Gaussian blur having a different kernel size.

Figure 14:
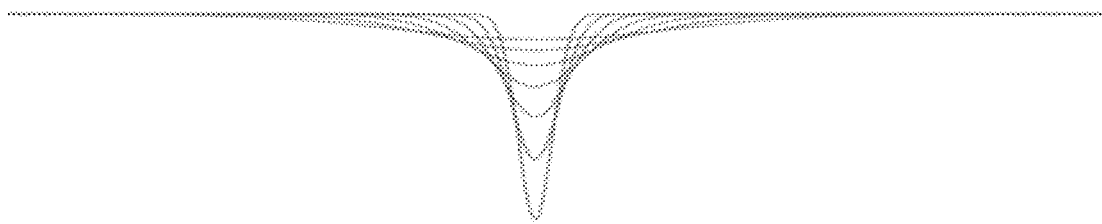
Figure 15:
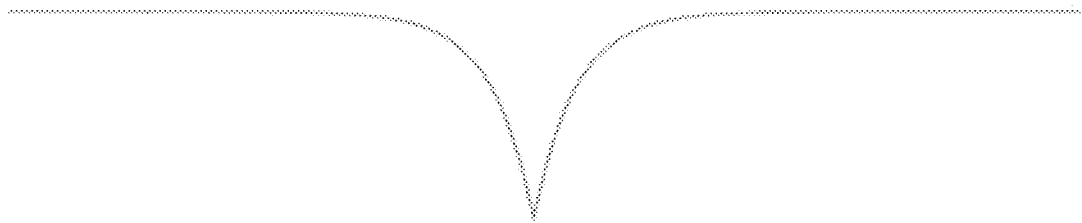

For example, the implementation of the method may consider the envelope of the initial fitting energy map and all its Gaussian blurs (see FIG. 14).

The implementation of the method may consider the initial fitting energy map $E_i^0$ as a function defined in $\mathbb{R}^2$. The implementation of the method may define the Gaussian transform $G_\sigma * E_i^0$ of $E_i^0$ with a standard deviation $\sigma$:

$$(G_\sigma * E_i^0)(x, y) = \int_{-\infty}^{+\infty} \int_{-\infty}^{+\infty} \frac{1}{\sqrt{2\pi} \cdot \sigma} e^{\left(-\frac{(x-u)^2 + (y-v)^2}{2\sigma^2}\right)} E_i^0(u, v) du dv$$

The smoothed fitting energy map may be defined as the envelope of the family of functions $E_i^0 \cup \{G_\sigma * E_i^0\}_{\sigma \in \mathbb{R} > 0}$.

The implementation of the method may apply an approximation of this envelope by iterating successive Gaussian blurs while increasing the kernel size and combine them with the previous image by keeping the minimum value for each pixel, e.g. $E_i^k = \min(E_i^{k-1}, G_k * E_i^0)$ where $G_k$ is the Gaussian filter with kernel size $2k+1$, and $E_i^0$ is the initial unsmoothed map. Faster ways of producing a similar result implementable by the method, however with lower or at least different gradient values, is to either skip some intermediate filters, e.g. $E_i^k = \min(E_i^{k-1}, G_{2k} * E_i^0)$, or else convolute the Gaussian filters iteratively (since applying multiple successive Gaussian filters is equivalent to applying a single Gaussian filter with a higher kernel size), e.g. $E_i^k = \min(E_i^{k-1}, G_k * \varepsilon_i^k)$ with $\varepsilon_i^k = G_k * \varepsilon_i^{k-1}$ and $\varepsilon_i^0 = E_i^0$.

Any other filter that generates a similar map would serve equally well and may thus be applied by the method, e.g. using a filter that convolutes the image with a kernel obtained from a Laplace distribution results in something quite similar (see FIG. 15), i.e.:

$$(L_\sigma * E_i^0)(x, y) = \int_{-\infty}^{+\infty} \int_{-\infty}^{+\infty} \frac{1}{4\sigma} e^{\left(-\frac{|x-u| + |y-v|}{2\sigma}\right)} E_i^0(u, v) du dv$$

Figure 16:
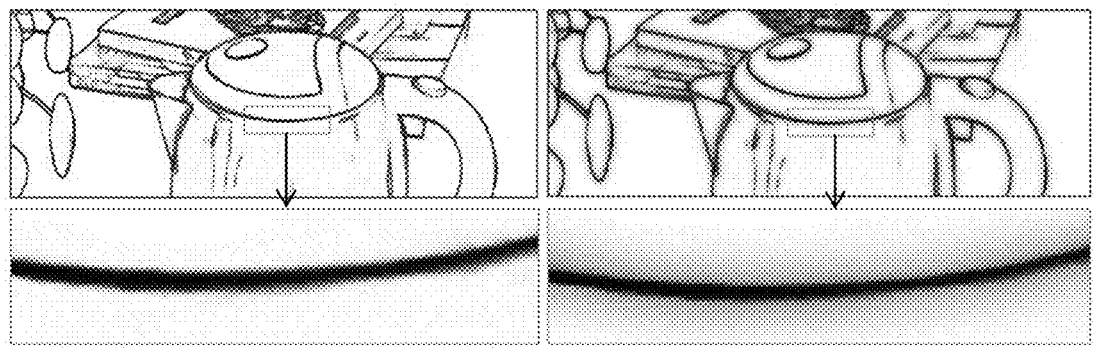
Figure 17:
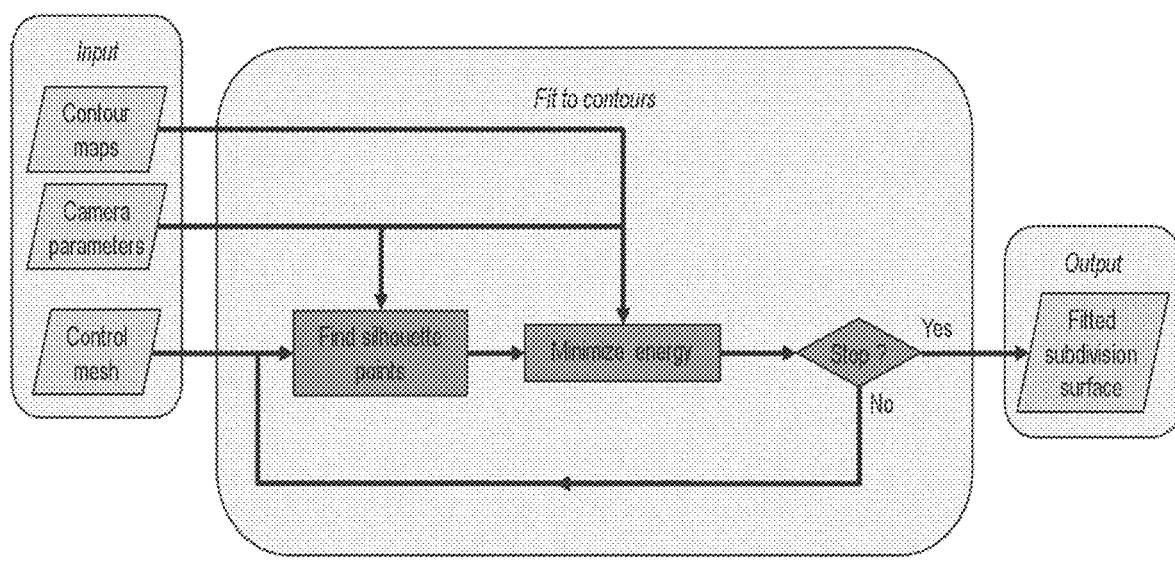

FIG. 16 shows a close up view of a contour map before and after applying this kind of filter.

In conclusion, the implementation of the method may operate a fitting energy map that has non-zero gradients, which locally decrease in a monotonous way towards the minimum value, thus increasing the convergence speed. However, the implementation of the method may not require more than $C_0$ continuity at the minimum.

As mentioned earlier, another approach might have been to use a distance transform of the image in order to generate a map that contains the distance to the nearest contour at each pixel. However, this would require a threshold value to identify the contours that have a probability value above that threshold and then compute the distance transform of the image. This means that the difference in probability of two contours that are both within the threshold is lost, whereas the implementation of the method allows exploitation of the result of the contour detection algorithm in its entirety.

Examples of the fitting to the contours are now discussed.

The implementation of the method may fit the earlier-discussed quad-dominant control mesh to all provided images by minimizing a fitting energy between the silhouette of the subdivision surface and the contours in the contour maps (one for each provided image). The fitting energy may, rather than using the distance between the silhouettes and the contours in each image, use the earlier-discussed fitting energy maps computed for each image. At each iteration, the process first computes the silhouettes for the current limit surface, and then deforms the surface by minimizing the fitting energies for all images (see FIG. 17).

Because the camera parameters are already known, the implementation of the method may separate the computation of the silhouette points on the 3D surface, which can be done explicitly and does not require an optimization. This is in opposition to methods which consider the (simplified) camera parameters and the silhouette points on the 3D surface as unknown variables and perform a more complex optimization, and whose energy function is defined in a variable space of a considerably higher dimension, leading to presumably longer computation times and maybe less robust computation results. Specifically, the dimension of the variable space in such methods would grow with the number of provided images, thus ultimately limiting the number of images that can be used. The optimization of the implementation of the method on the contrary is performed in a variable space whose dimension only depends on the number of vertices in the control mesh and is independent of the number of provided images, which makes it easier to use many images and thus to better describe the object.

The method may comprise, at each iteration of the optimizing, providing a current control mesh, subdividing the current control mesh into a subdivided mesh, executing a loop on each 2D image, and modifying the current control mesh to reduce the energy. The loop comprises, for each 2D image, projecting the subdivided mesh on the 2D image, computing a 2D silhouette of the 3D modeled object in the 2D image, and identifying points of the subdivided mesh corresponding to the 2D silhouette, as the silhouette vertices. This is detailed in the following. Optionally, the topology of the subdivided mesh after the first iteration may be stored, so as to be reused at the next iterations of the subdividing. This allows saving time.

Thus, the determination of the 3D silhouette vertices may be redone with each iteration of the optimization. The topology of the mesh (connections between vertices, number of edges, and number of polygons) does not change. The topology of the overall shape in the sense of the Euler characteristic does not change either. The subdivision, in the sense of determining the connections between the subdivided vertices, may therefore only be done once. On the other hand, as the coordinates of the vertices of the control mesh change, the method may recalculate the coordinates of the vertices of the subdivided mesh (which approaches the limit surface) after each iteration. The calculation of the 3D silhouettes vertices may come after.

Figure 18:
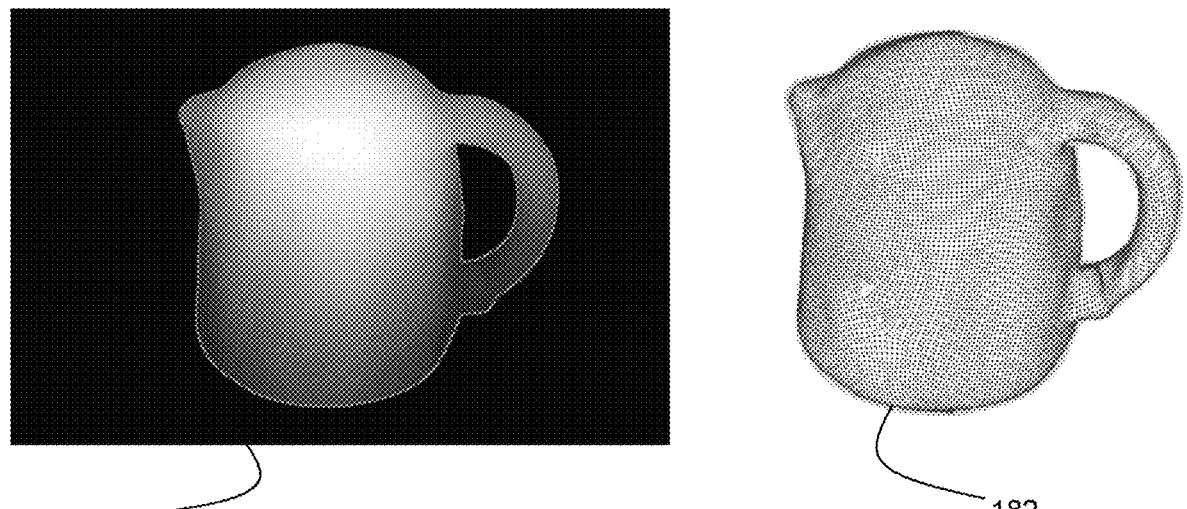

Sets of silhouette points may be computed for each image by using the camera parameters and computing a depth map of the current shape of the subdivision surface and keeping only the points whose image is a border pixel of the object's projection (see FIG. 18: depth map and border pixels 180 on the left side, subdivided mesh and silhouette points 182 on the right side). If several points project on the same pixel, the one that has the same depth as the depth value at the pixel may be used, i.e. the implementation of the method may avoid using hidden points in the silhouette.

The implementation of the method may identify the location of the silhouettes on the current shape of the subdivision surface for its projection in each image i. The implementation of the method may approximate the subdivision surface by subdividing the control mesh a sufficient number of times n into a refined mesh $R_n$. The implementation of the method may subdivide three times, but n is a parameter that can be defined at the beginning of the process. The implementation of the method may therefore look for the subset $\Sigma_i$, of vertices of $R_n$ that will project on the silhouette of the shape in i. Since $R_n$ is sufficiently refined, these vertices give a good approximation of the actual location of the silhouette on the subdivision surface.

Using the projection transformation $\pi_i$ for image i, the implementation of the method may compute the depth map $D_i$, of the scene that contains only the current shape of the subdivision surface. The implementation of the method may identify the subset of silhouette pixels $S_i$, of $D_i$, so that any silhouette pixel $p_s \in S_i$, is adjacent to a background pixel $p_{bg}$. Background pixels are identified by a depth value $D_i(p_{bg})$ that is traditionally set to 0 in depth maps. The implementation of the method may extend the silhouette pixels by including pixels that are not directly adjacent to background pixels but lie in a neighborhood (the size of which may also be defined) that includes a background pixel.

Having identified all silhouette points, the implementation of the method may verify for each vertex v of $R_n$ whether its projection $\pi_i(v)$ is a silhouette pixel $p_s$ in which case v is part of the subset of silhouette vertices $\Sigma_i$, of $R_n$. If several vertices project on the same pixel, only the vertex with the same depth as the computed pixel depth is kept in $\Sigma_i$.

The implementation of the method may now compute the value of the fitting energy for each silhouette vertex $v \in \Sigma_i$ with $E_i(\pi_i(v))$ where $E_i$, is the fitting energy map computed for image i.

If $E_i(\pi_i(v))$ reaches a minimum, then the silhouette vertex projects onto a contour identified in the image.

If all fitting energy values, for all silhouette vertices and all images, (globally) reach a minimum, then the projected silhouettes of the subdivision surface are identical to the identified silhouettes of the object in the images (because the implementation of the method starts with a shape that is already close to the object).

Figure 19:
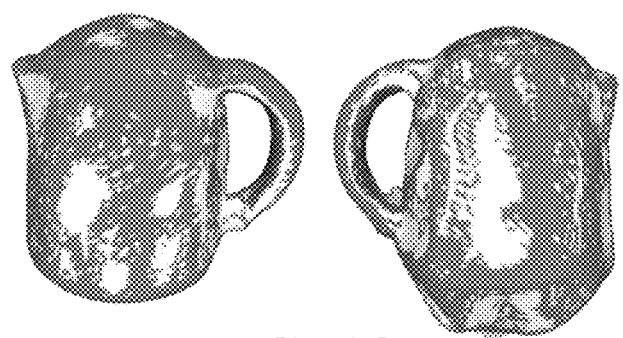
Figure 20:
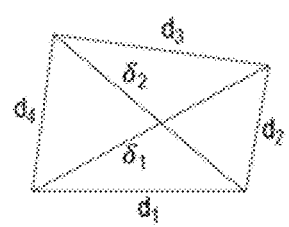

To verify how well the provided images cover the form of the surface, a visual verification was made by coloring all vertices that appear as silhouette points in at least one or more images (see FIG. 19: grey areas appear as silhouettes in at least one image, white areas are not part of any silhouette).

Each silhouette point may be assigned a value from its fitting energy map. The sum of the squares of these values may define the main fitting energy term to be minimized. Since the silhouette points are computed on the limit surface of the subdivision (or at least on the mesh resulting from a number of subdivision steps), it can be expressed as a linear function of the vertex coordinates of the control mesh, i.e. the variables of the problem to be solved.

$\pi_i$ Projection transformation for image i (based on the provided camera parameters)

x Vertex coordinates of control mesh $s_{ij} = S_{ij}(x)$ Silhouette point j on the subdivision surface for a given image i ($S_{ij}$ is a linear function of x)

$e_{ij} = E_i(\pi_i(s_{ij}(x)))$ Fitting energy for a silhouette point (using the fitting energy map $E_i$, of image i), i.e. the lower the fitting energy, the higher the probability that the point projects on a contour The fitting energy term may be defined by $E_{fit} = \Sigma_{i,j} e_{ij}^2$ which may be minimized for the silhouettes to fit the contours in all images.

Since the 3D modeled object is a control mesh (of a subdivision surface), specific terms may be added. Notably, the energy may reward lowness of a sum of squares of lengths of all edges in the control mesh, lowness of a sum of squares of principal curvature values at densely sampled points of a limit surface of the control mesh, and/or regularity of faces of the control mesh. This allows obtaining an industrially cleaner control mesh, which performs more accurately in simulations and is easier to manipulate.

This may correspond to three different regularization terms being included in the total energy to minimize:

$E_{edges} = \Sigma d_{edge}^2$ The sum of the squares of the lengths of all edges in the control mesh. $E_{edges}$ is a quadratic function of x.

$E_{curvature} = \Sigma c_1^2 + c_2^2$ The sum of the squares of the two principal curvature values $c_1$ and $c_2$ at densely sampled points of the limit surface. The method may in particular use the curvature values, rather than the second order derivatives with respect to parameters defined on the subdivision surface, because it is more directly linked to the shape of the surface and independent of the parameterization. For subdivision surfaces, the second order derivatives can be easily evaluated using x. The principal curvatures may be computed from the second order derivatives.

$E_{quad} = \Sigma \Delta_1^2 + \Delta_2^2 + \Delta_3^2$ This term favors regular quad shapes in the resulting control mesh. For each quad (see FIG. 20), $\Delta_1 = \delta_1^2 - \delta_2^2$, $\Delta_2 = d_1^2 - d_2^2$ and $\Delta_3 = d_3^2 - d_4^4$ may be defined. A possible variant is $\Delta_2 = d_1^2 - d_3^2$ and $\Delta_3 = d_2^2 - d_4^2$. All these values can be expressed analytically as functions of x.

Finally, the implementation of the method may also introduce an optional energy term that measures the global variation of the curvature (the sum of the squares of the partial derivatives of the main curvatures may be used):

$$E_{curvature\ variation} = \sum \left( \frac{\partial c_1^2}{\partial u} + \frac{\partial c_1^2}{\partial v} + \frac{\partial c_2^2}{\partial u} + \frac{\partial c_2^2}{\partial v} \right)$$

The optimization scheme may determine vertex coordinates $x_{min}$ that minimize the total Energy $E = E_{fit} + \alpha E_{edges} + \beta E_{curvature} + \gamma E_{quad} + \delta E_{curvature\ variation}$, where $\alpha$, $\beta$, $\gamma$ and $\delta$ are weight parameters, that can either be provided or else computed at the initial evaluation of the energy terms in order to ensure specific ratios between the four terms. These ratios can be either default values of the system or else user-provided.

Since $E_{fit}$ uses discrete map functions $E_i$, the implementation of the method may apply Sobel filters to generate maps that approximate the gradient of $E_i$ and use these to analytically evaluate the Jacobian matrix for $E_{fit}$. The Jacobian matrices for the other energy terms may be numerically approximated.

The implementation of the method may use a numerical optimization solver (e.g. Levenberg-Marquardt) to determine $x_{min}$.

Since the implementation of the method does not have an explicit expression of the silhouette, the implementation of the method may only compute a single minimization step per iteration, and then use the resulting vertex coordinates to update the control mesh. If the energy is sufficiently small, the process may be stopped and result in the updated control mesh, otherwise the process is re-iterated (see FIG. 17).

Figure 21:
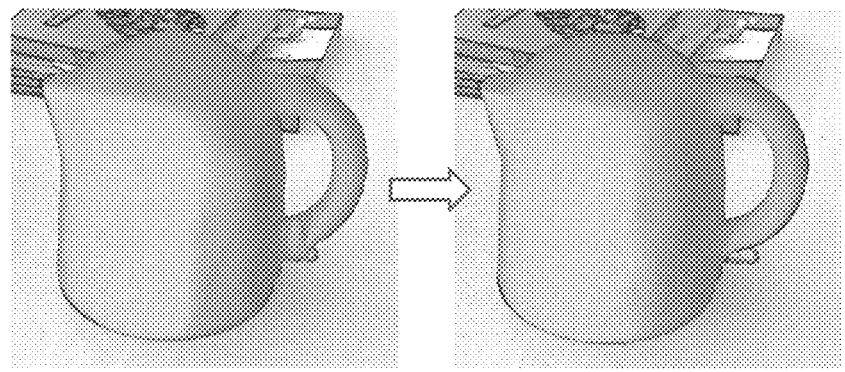
Figure 22:
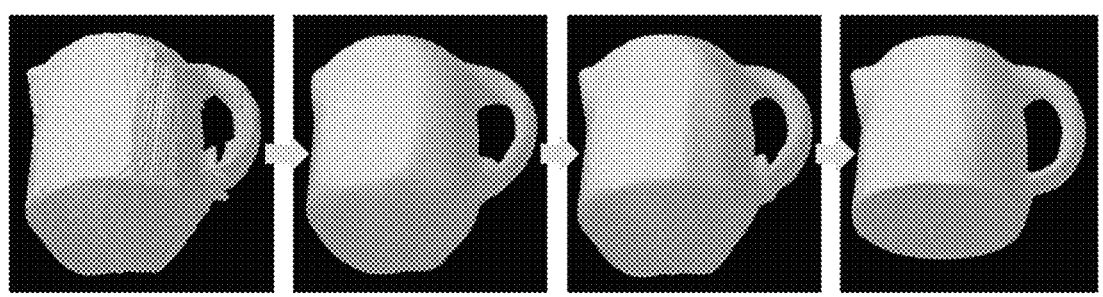

Consequently, the silhouettes of the subdivision surface, based on the resulting control mesh, are an optimal fit to the contours found in the provided images (see FIG. 21).

An additional benefit of the implementation of the method is that areas that were not covered by silhouettes may usually be smoothed or flattened. For instance, the flat base of an object sitting or lying on a table may be poorly covered by the images, since such objects are usually photographed from above. Because of this, the carving may generate non-flat, possibly pointed areas, which may, however, be flattened by the method during the contour fitting phase (see FIG. 22).

If more information, e.g. planar areas, symmetry planes, etc., is available, it may be taken into account in the optimization scheme, i.e. either by constraining the positions of (some of) the control vertices, or, by directly reducing the number of variables. In case of identified symmetry planes, the control vertices on one side of the symmetry plane may be constrained to be the mirror image of an identified control vertex on the other side of the symmetry plane, thus reducing the number of control vertices by approximately 50%. Control vertices in identified planar areas may be defined by two parameters on the plane instead of three spatial coordinates. The same can be done for identified spherical or cylindrical areas of the shape.

Examples of the optional smoothing of unfitted areas are now discussed.

As earlier-mentioned, not all areas of the resulting fitted subdivision surface are seen as silhouettes and thus are not fitted to anything. It is therefore possible that the surface is locally less smooth in these areas.

The examples may attempt to smooth these areas by performing a post-processing phase that consists in minimizing an energy that is composed of the terms $E_{edges}$, $E_{curvature}$, $E_{quad}$, $E_{curvature\ variation}$, while maintaining a set of constraints $C_{fix}$.

The first four terms have been discussed earlier. $C_{fix}$ represents the constraints that keeps each point of the surface that is on a silhouette at its original position, which is the position reached before the optional smoothing, effectively constraining the form to stick to its original shape in those areas.

All four smoothing terms, $E_{edges}$, $E_{curvature}$, $E_{quad}$, $E_{curvature\ variation}$, use non-uniform weights to reduce their effect on areas that appear in silhouettes and increase their effect in areas not covered by any silhouettes. While the task of determining how to weight the different terms with respect to one another is not straightforward, it has been observed that using these examples of the implementation of the method has further smoothed some remaining bumpiness in such areas.

The invention claimed is:

1. A computer-implemented method for 3D reconstruction, the method comprising:
   obtaining 2D images which all represent a same real object which is fixed, and, for each 2D image, camera parameters which define a perspective projection;
   obtaining, for each 2D image, a smooth map, the smooth map having pixel values each representing a measurement of contour presence, the contour being a location of separation between two different textures of the 2D image, the smooth map including local extrema corresponding to contour probability maxima, an energy rewarding high contour probability at projections of silhouette vertices, the smooth map varying from values representing a respective zero contour probability to the local extrema, the smooth map having non-zero gradients at least in a vicinity of image contours, a gradient of the smooth map being thereby non-zero at pixels corresponding to zero contour probability, the smooth map locally varying monotonously towards local optima and presenting $C_0$ continuity; and determining a 3D modeled object that represents the real object, the 3D modeled object being a control mesh of a subdivision surface, the control mesh being determined from an initial dense mesh approximating the real object, the determining iteratively optimizing energy that rewards, for each smooth map, projections of silhouette vertices of the 3D modeled object having pixel values, on the smooth map, representing a high measurement of contour presence, the optimization iteratively following a monotonous gradient path on the smooth map, wherein the method further comprises, at each iteration of the optimizing:

obtaining a current first mesh, which is a control mesh;
obtaining a current second mesh, the current second mesh being obtained by subdividing the current first mesh;
for each 2D image:
   projecting the current second mesh on the 2D image;
   computing a 2D silhouette of the 3D modeled object in the 2D image; and
   identifying points of the current second mesh corresponding to the 2D silhouette, as the silhouette vertices; and
modifying the current first mesh to reduce the energy, the modified current first mesh of each respective iteration having a next iteration being the current first mesh of the next iteration, the current second mesh of the next iteration thereby having different coordinates of vertices from the current second mesh of the respective iteration.

2. The method of claim 1, wherein the smooth map is a function of a contour probability map.

3. The method of claim 2, wherein the function is a smoothing of an affine mapping.

4. The method of claim 3, wherein the smoothing further includes at least one application of a Gaussian blur to the contour probability map, or a convolution of the contour probability map with a kernel obtained from a Laplace distribution.

5. The method of claim 4, wherein the smoothing further includes determining an envelope of application of a family of Gaussian blurs to the contour probability map, each Gaussian blur having a different kernel size.

6. The method of claim 2, wherein the energy comprises a term of a type:

$$E_{fit} = \sum_{i,j} E_i(\pi_i(s_{ij}))^2$$

where for a 2D image i:
$E_i(\bullet)$ denotes the smooth map,
$s_{ij}$ denotes a silhouette point j, and
$\pi_i(\bullet)$ denotes a projection transformation.

7. The method of claim 3, wherein the energy comprises a term of a type:

$$E_{fit} = \sum_{i,j} E_i(\pi_i(s_{ij}))^2$$

where for a 2D image i:
$E_i(\bullet)$ denotes the smooth map,
$s_{ij}$ denotes a silhouette point j, and
$\pi_i(\bullet)$ denotes a projection transformation.

8. The method of claim 4, wherein the energy comprises a term of a type:

$$E_{fit} = \sum_{i,j} E_i(\pi_i(s_{ij}))^2$$

where for a 2D image i:
$E_i(\bullet)$ denotes the smooth map,
$s_{ij}$ denotes a silhouette point j, and
$\pi_i(\bullet)$ denotes a projection transformation.

9. The method of claim 5, wherein the energy comprises a term of a type:

$$E_{fit} = \sum_{i,j} E_i(\pi_i(s_{ij}))^2$$

where for a 2D image i:
$E_i(\bullet)$ denotes the smooth map,
$s_{ij}$ denotes a silhouette point j, and
$\pi_i(\bullet)$ denotes a projection transformation.

10. The method of claim 1, wherein the energy includes a term of a type:

$$E_{fit} = \sum_{i,j} E_i(\pi_i(s_{ij}))^2$$

where for a 2D image i:
$E_i(\bullet)$ denotes the smooth map,
$s_{ij}$ denotes a silhouette point j, and
$\pi_i(\bullet)$ denotes a projection transformation.

11. The method of claim 1, wherein the energy further rewards:
lowness of a sum of squares of lengths of all edges in the control mesh,
lowness of a sum of squares of principal curvature values at densely sampled points of a limit surface of the control mesh, and/or
regularity of faces of the control mesh.

12. The method of claim 1, wherein the energy includes a term that is minimized for silhouettes to fit contours in all images.

13. A non-transitory computer readable storage medium having recorded thereon a computer program that when executed by a computer causes the computer to implement a method for 3D reconstruction, the method comprising:
obtaining 2D images which all represent a same real object which is fixed, and, for each 2D image, camera parameters which define a perspective projection;
obtaining, for each 2D image, a smooth map, the smooth map having pixel values each representing a measurement of contour presence, the contour being a location of separation between two different textures of the 2D image, the smooth map including local extrema corresponding to contour probability maxima, an energy rewarding high contour probability at projections of silhouette vertices, the smooth map varying from values representing a respective zero contour probability to the local extrema, the smooth map having non-zero gradients at least in a vicinity of image contours, a gradient of the smooth map being thereby non-zero at pixels corresponding to zero contour probability, the smooth map locally varying monotonously towards local optima and presenting $C_0$ continuity; and determining a 3D modeled object that represents the real object, the determining iteratively optimizing an energy that rewards, for each smooth map, projections of silhouette vertices of the 3D modeled object having pixel values, on the smooth map, representing a high measurement of contour presence, the optimization iteratively following a monotonous gradient path on the smooth map, wherein the method further comprises, at each iteration of the optimizing:

obtaining a current first mesh, which is a control mesh;

obtaining a current second mesh, the current second mesh being obtained by subdividing the current first mesh;

for each 2D image:
  projecting the current second mesh on the 2D image;
  computing a 2D silhouette of the 3D modeled object in the 2D image; and
  identifying points of the current second mesh corresponding to the 2D silhouette, as the silhouette vertices; and modifying the current first mesh to reduce the energy, the modified current first mesh of each respective iteration having a next iteration being the current first mesh of the next iteration, the current second mesh of the next iteration thereby having different coordinates of vertices from the current second mesh of the respective iteration.

14. The non-transitory computer readable storage medium of claim 13, wherein the smoothing includes at least one application of a Gaussian blur to the contour probability map, or a convolution of the contour probability map with a kernel obtained from a Laplace distribution.

15. The non-transitory computer readable storage medium of claim 13, wherein the energy comprises a term of a type:

$$E_{fit} = \sum_{i,j} E_i(\pi_i(s_{ij}))^2$$

where for a 2D image i:
$E_i(\cdot)$ denotes the smooth map,
$s_{ij}$ denotes a silhouette point j, and
$\pi_i(\cdot)$ denotes a projection transformation.

16. A system comprising:
a processor coupled to a memory and a graphical user interface, the memory having recorded thereon a computer program for 3D reconstruction that when executed by the processor causes the processor to be configured to:

obtain 2D images which all represent a same real object which is fixed, and, for each 2D image, camera parameters which define a perspective projection, obtain, for each 2D image, a smooth map, the smooth map having pixel values each representing a measurement of contour presence, the contour being a location of separation between two different textures of the 2D image, the smooth map including local extrema corresponding to contour probability maxima, an energy rewarding high contour probability at projections of silhouette vertices, the smooth map varying from values representing a respective zero contour probability to the local extrema, the smooth map having non-zero gradients at least in a vicinity of image contours, a gradient of the smooth map being thereby non-zero at pixels corresponding to zero contour probability, the smooth map locally varying monotonously towards local optima and presenting $C_0$ continuity, and determine a 3D modeled object that represents the real object, the determining iteratively optimizing an energy that rewards, for each smooth map, projections of silhouette vertices of the 3D modeled object having pixel values, on the smooth map, representing a high measurement of contour presence, the optimization iteratively following a monotonous gradient path on the smooth map, wherein the processor is further configured to, at each iteration of the optimizing:

obtain a current first mesh, which is a control mesh;

obtain a current second mesh, the current second mesh being obtained by subdividing the current first mesh;

for each 2D image:
  project the current second mesh on the 2D image;
  compute a 2D silhouette of the 3D modeled object in the 2D image; and
  identify points of the current second mesh corresponding to the 2D silhouette, as the silhouette vertices; and modify the current first mesh to reduce the energy, the modified current first mesh of each respective iteration having a next iteration being the current first mesh of the next iteration, the current second mesh of the next iteration thereby having different coordinates of vertices from the current second mesh of the respective iteration.

* * * * *